(12) United States Patent
Reichel et al.

(10) Patent No.: US 8,174,254 B2
(45) Date of Patent: May 8, 2012

(54) MEASURING DEVICE WITH NEGATIVE-FEEDBACK DC VOLTAGE AMPLIFIER

(75) Inventors: Thomas Reichel, Baldham (DE); Michael Katzer, Munich (DE); Toralf Bratfisch, Putzbrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 719 days.

(21) Appl. No.: 12/302,647

(22) PCT Filed: Apr. 26, 2007

(86) PCT No.: PCT/EP2007/003705
§ 371 (c)(1),
(2), (4) Date: Nov. 26, 2008

(87) PCT Pub. No.: WO2007/137660
PCT Pub. Date: Dec. 6, 2007

(65) Prior Publication Data
US 2009/0243592 A1    Oct. 1, 2009

(30) Foreign Application Priority Data

May 26, 2006    (DE) .......................... 10 2006 024 699

(51) Int. Cl.
    *G01R 21/00* (2006.01)
(52) U.S. Cl. .................................................. 324/123 C
(58) Field of Classification Search .................. None
    See application file for complete search history.

(56) References Cited

U.S. PATENT DOCUMENTS

| | | | |
|---|---|---|---|
| 4,243,940 A | 1/1981 | Ruof | |
| 4,970,456 A | 11/1990 | Holcomb et al. | |
| 5,083,080 A | 1/1992 | Tagiri | |
| 5,315,260 A * | 5/1994 | Link et al. | ..................... 327/184 |
| 5,373,237 A | 12/1994 | Imperato | |
| 5,869,986 A | 2/1999 | Haque et al. | |

FOREIGN PATENT DOCUMENTS

| | | |
|---|---|---|
| DE | 24 22 030 | 11/1975 |
| DE | 2422030 A1 | 11/1975 |
| DE | 24 44 655 A1 | 4/1976 |
| DE | 31 43 669 A1 | 5/1983 |
| DE | 32 07 144 A1 | 9/1983 |
| DE | 690 19 422 T2 | 3/1996 |
| DE | 197 10 474 A1 | 1/1998 |
| DE | 199 13 338 A1 | 9/2000 |
| DE | 199 55 342 A1 | 5/2001 |

(Continued)

OTHER PUBLICATIONS

International Search Report on Patentability, PCT/EP2007/003705, Jan. 29, 2009, pp. 1-10.

(Continued)

*Primary Examiner* — Paresh Patel
(74) *Attorney, Agent, or Firm* — Ditthavong Mori & Steiner, P.C.

(57) ABSTRACT

A measuring device having a detector with at least one detector element and, connected downstream of the detector, a DC voltage amplifier with at least one input (and at least one output. The DC voltage amplifier provides at least one negative-feedback path, which extends from its at least one output to its at least one input, wherein at least one further detector element is disposed in the negative-feedback path.

19 Claims, 4 Drawing Sheets

FOREIGN PATENT DOCUMENTS

| | | |
|---|---|---|
| EP | 0 087 501 A2 | 9/1983 |
| EP | 0 405 593 A2 | 1/1991 |
| EP | 0405593 A2 | 1/1991 |
| GB | 1501730 | 2/1978 |
| WO | 01/36988 A1 | 5/2001 |
| WO | WO 01/36988 A1 | 5/2001 |

OTHER PUBLICATIONS

International Search Report, WO 2007/137660 A1, Rohde & Schwarz GmbH Co. KG, Sep. 27, 2007, pp. 1-6.

* cited by examiner

MEASURING DEVICE WITH NEGATIVE-FEEDBACK DC VOLTAGE AMPLIFIER

CROSS-REFERENCE TO RELATED APPLICATION

The present application is a national stage application based upon PCT Application No. PCT/EP2007/003705 filed on Apr. 26, 2007, and claims priority to German Patent Application No. 10 2006 024 699.3 filed on May 26, 2006, the entire contents of which are herein incorporated by reference.

BACKGROUND OF THE INVENTION

1. Field of the Invention

The invention relates to a measuring device with a DC voltage amplifier especially for measuring the envelope power and/or the mean power of a high-frequency signal.

2. Discussion of the Background

A measuring device is known from DE 199 55 342 A1. The envelope power and also the mean-power or RMS values can both be measured with the measuring device disclosed in this document. In order to cover the largest possible dynamic range, the measuring device is subdivided into several individual ranges, which are each allocated to several measuring branches disposed in parallel. A chopper is arranged in each measuring branch. All choppers are controlled synchronously. Moreover, an analog/digital converter, which is supplied with a synchronous clock-pulse rate, is disposed in each measuring branch. After a weighted addition of the digitized measuring signals of the individual measuring branches, a synchronous demodulation is implemented before the signal is evaluated.

The use of parallel measuring branches in the measuring device known from DE 199 55 342 A1, which is associated with an extremely complex design for the measuring device, is disadvantageous. In addition to the synchronization of the choppers and the analog/digital converters, it must be ensured that the group delay time of the measured signal is of exactly the same value in all measuring branches. Especially in the video bandwidths to be realized in the order of magnitude of 30 MHz, this causes difficulties in practice. With a single-path realization of the measuring device, an adequate compression of the dynamic range must be ensured. Moreover, an amplifier with low noise influence and low temperature dependence of the transmission characteristic is required.

SUMMARY OF THE INVENTION

The invention is advantageously provides a measuring device especially for measuring the envelope power and/or the mean power of a high-frequency signal, which provides an amplifier with low noise influence and which achieves a very low temperature dependence of the transmission characteristic.

According to the invention, the DC voltage amplifier is provided with at least one negative-feedback path, which connects the output to the input and in which a further detector element is disposed. This provides a negative feedback, which has a similar characteristic to the detector, because substantially the same detector elements are used in the detector and in the negative-feedback path.

The DC voltage amplifier is preferably designed as a differential amplifier and amplifies a differential input voltage between its two inputs to form a differential output voltage between its two outputs. In this case, two feedback paths are present: a first feedback path from the first output to the first input, and a second feedback path from the second output to the second input.

A detector element, which determines the feedback, is disposed in each of these two feedback paths. Instead of the differential amplifier, a separate amplifier, for example, in each case an operational amplifier, can be used between the first input and the first output, and the second input and the second output.

The detector preferably provides two detector elements. This is advantageous particularly when using detector diodes, which are arranged in the detector with reversed polarity and which, in the manner of a two-way rectifier, each detect a half wave of the high-frequency input signal. In this case, the chopper is preferably designed as a switchover unit, which connects the first detector element, or respectively the first detector diode, to the first input of the DC voltage amplifier during a first chop phase, and, during the same chop phase, connects the second detector element, or respectively the second detector diode, to the second input of the DC voltage amplifier. The definition of the inputs is reversed in the second chop phase. During the first chop phase, the first input of the DC voltage amplifier therefore receives a signal, which is substantially generated from the detected, positive half wave, while the second input of the DC voltage amplifier receives a signal, which is generated substantially from the detected, negative half wave. This is reversed during the second chop phase.

In this context, it is advantageous if two detector elements are disposed respectively in both feedback paths. If the detector elements are detector diodes, these detector diodes should be arranged in an anti-parallel manner, so that, in a first chop phase, a first detector diode substantially determines the magnitude of the feedback in each feedback path, and the other detector diode substantially determines the magnitude of the feedback in the other chop phase. In each case, this is always the diode, of which the polarity is in the direction of flow; while the other diode, disposed respectively in the anti-parallel direction, blocks and therefore hardly influences the feedback signal.

It is advantageous if the differential amplifier provides a control input for controlling the symmetry of the output signal. In this case, it is advantageous to connect the two inputs of the differential amplifier to the control input via a symmetrical network, for example, two resistors, and via an integrator. The control input can be designed simply as an operational amplifier with a capacitor between the output and the inverting input.

BRIEF DESCRIPTION OF THE DRAWINGS

An exemplary embodiment of the invention is described in greater detail below with reference to the drawings. The drawings are as follows.

DETAILED DESCRIPTION OF EXEMPLARY EMBODIMENTS OF THE INVENTION

Figure 1:
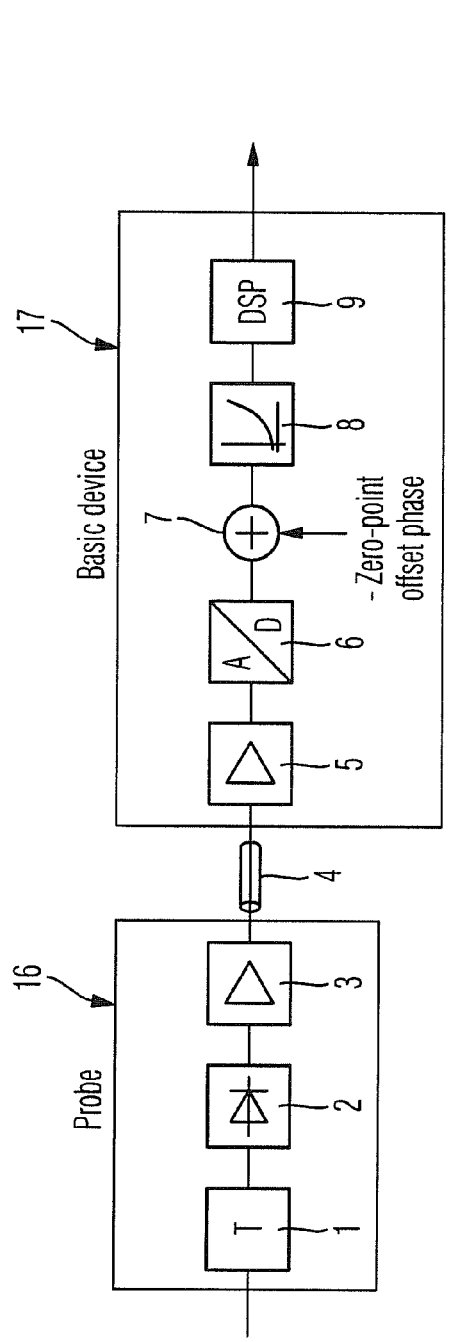
FIG. 1 shows a measuring device according to the prior art.

FIG. 1 shows a hitherto-conventional configuration of a measuring device for measuring the envelope power and the mean-power value. An attenuation element 1, an envelope detector 2, which is designed as a diode detector, and a preamplifier or line driver 3 are arranged in a probe 16. The probe 16 is connected to the basic unit 17 via a connecting cable 4. The main amplifier 5, an analog/digital converter 6, a summation unit 7 for subtraction of the zero-point offset, a device 8 for characteristic correction and a digital signal processor with further evaluation functions, for example, for displaying the envelope curve, for calculating the mean-power value and so on, are disposed in the basic unit 17. The device for characteristic correction 8 and the digital signal processor 9 together form an evaluation device 8, 9.

Figure 2:
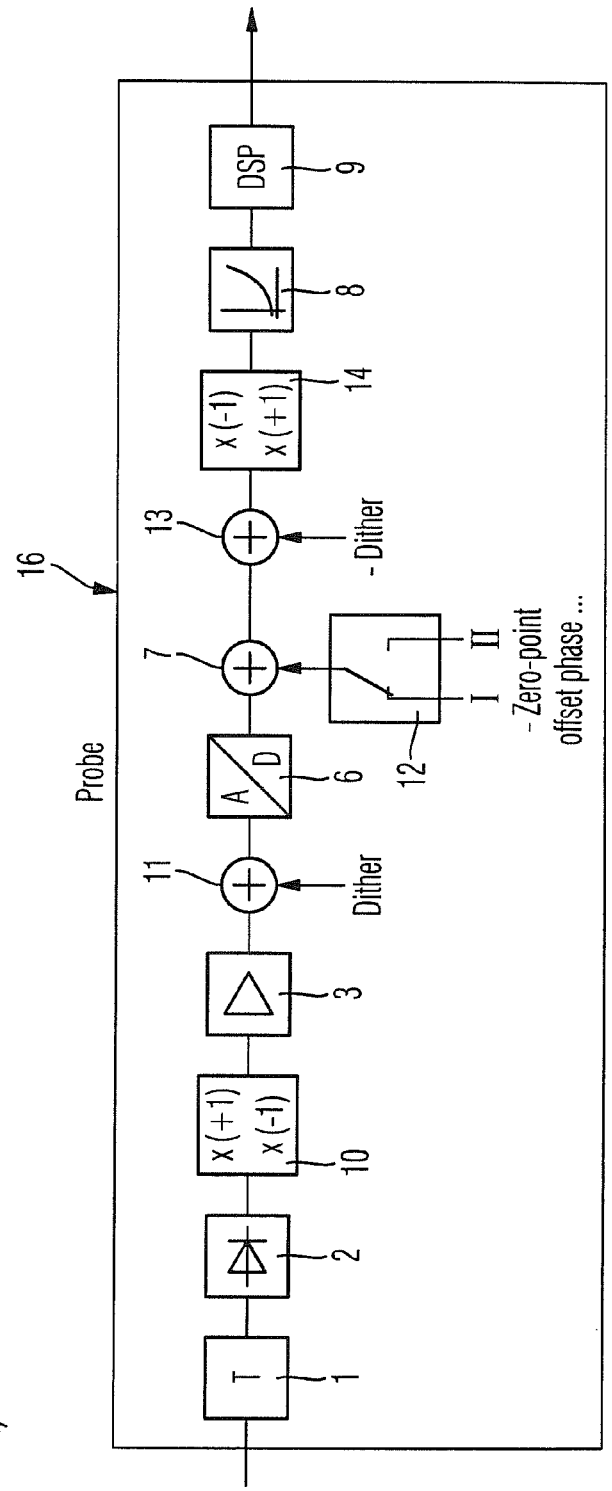
FIG. 2 shows an overview of an exemplary embodiment of the measuring device according to the invention.

FIG. 2 shows an exemplary embodiment of the measuring device according to the invention in a mode, which is used for measuring the envelope power. One difference by comparison with the configuration according to FIG. 1 is that all the components of the measuring device according to the invention can preferably be disposed within the probe 16. A special basic unit exclusively for the power measurement may under some circumstances no longer be necessary. The probe 16 can be connected directly to a PC, for example, via a USB bus.

The other difference is that a feeder device 11 for feeding a dither signal is disposed between the detector 2 and the analog/digital converter 6, preferably after the amplifier 3. In this context, the feeder device 11 preferably supplies a first "dither" signal for measuring the envelope power and another, second dither signal, not illustrated in FIG. 2, for measuring the mean-power value.

The first dither signal can be removed from the measured signal digitized by the analog/digital converter 6 in a dither-elimination device 13. In the exemplary embodiment presented in FIG. 2, the dither-elimination device 11 for the dither signal ("dither") consists of an adder, to which the digital equivalent of the first dither signal is supplied with an inverted sign ("−dither"), so that the digital equivalent of the dither signal is subtracted from the digitized measured signal.

Moreover, a chopper 10 is disposed between the detector 2 and the DC voltage amplifier 3. The chopper 10 chops the measured signal by inverting the sign of the analog signal in a cyclical manner. Chopping provides the further advantage of considerably reducing the influence of the thermal drift of the DC voltage amplifier 3. The influence of the 1/f noise is also reduced. A synchronous demodulator 14, which multiplies the digitized measured signal by −1 or respectively +1 synchronously with the chopper 10, and which therefore eliminates the influence of the chopper 10, is disposed downstream of the analog/digital converter 6. This change of sign can be implemented very simply in a numerical manner without real multiplication.

Another peculiarity of the exemplary embodiment presented in FIG. 2 is that the device 7, 12 for the correction of the zero-point offset provides a switchover device 12, which allows a different zero-point correction for the two chop phases +1 and −1 of the chopper 10. The zero-point offsets can be stored independently of one another for the two chop phases in a memory device, which is not illustrated. The switchover device 12 is operated synchronously with the chopper 10.

Figure 3:
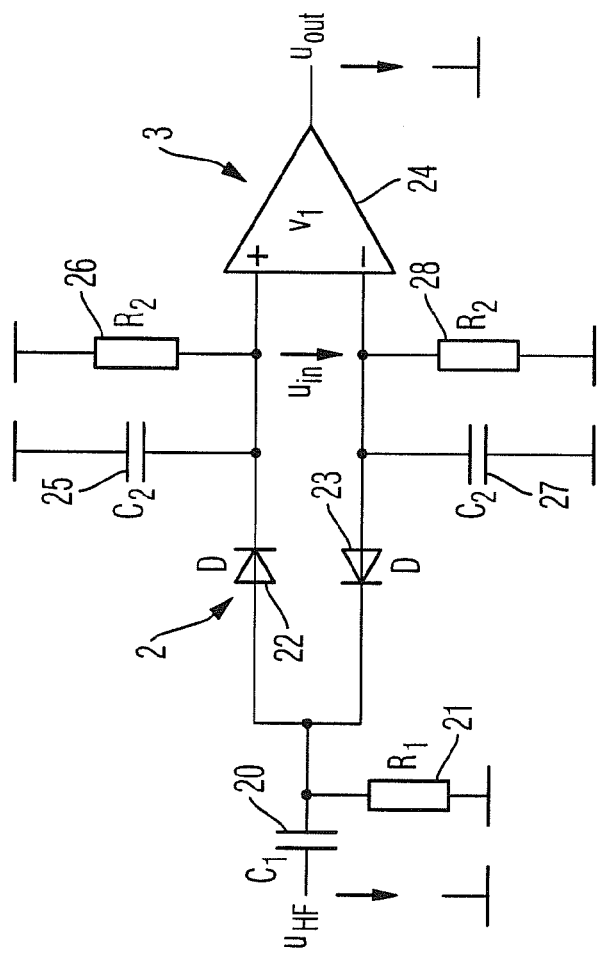
FIG. 3 shows an exemplary circuit diagram of the detector and the amplifier of a measuring device according to the prior art as shown in FIG. 1.

FIG. 3 shows a typical structure of the probe 16 in the region of the detector 2 and the DC voltage amplifier 3. The detector 2 consists of 2 detector diodes 22 and 23, which are connected in each case with different polarity, on the one hand, to a high-pass filter comprising the series capacitor 20 and the resistor 21, and, on the other hand, respectively to one of the two inputs of the DC voltage amplifier 24. At the outputs of the detector diodes 22 and 23 or respectively at the inputs of the DC voltage amplifier 24, a charging capacitor 25 and respectively 27, which is charged by the detector diodes 22 and respectively 23, and a discharge resistor 26 and respectively 28 for the discharge of the charging capacitors 25 and 27, are connected respectively to ground.

Figure 4:
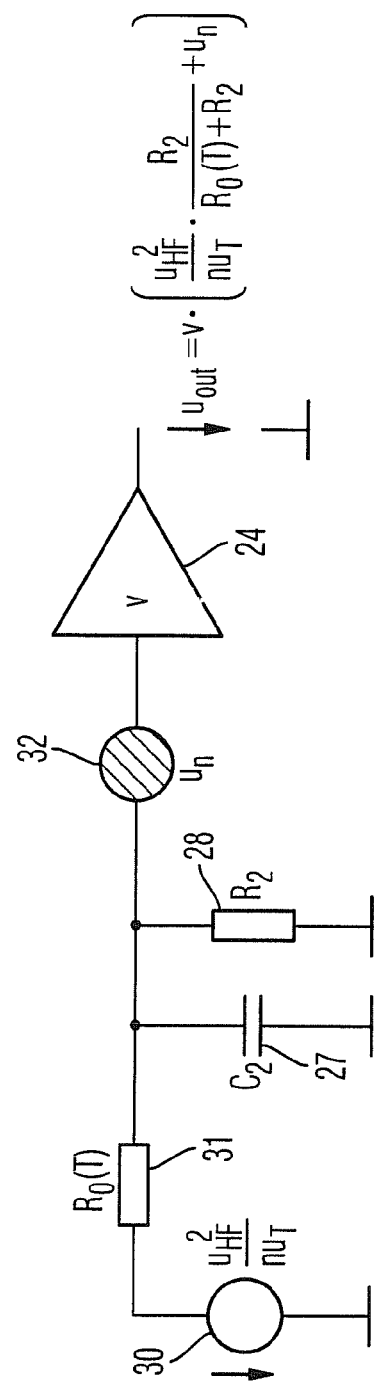
FIG. 4 shows the equivalent circuit diagram for low powers with voltage noise of the amplifier in the measuring device according to the prior art as shown in FIG. 3.

FIG. 4 illustrates the equivalent circuit diagram for low powers with voltage noise of the amplifier 3 according to the prior art as shown in FIG. 3. The equivalent circuit diagram describes the temperature-dependent noise behaviour of the amplifier circuit. An equivalent voltage source 30 generates a voltage $u^2_{HF}/nu_T$, wherein $u_{HF}$ denotes the input voltage of the high-frequency signal to be detected and $u_T$ denotes the temperature voltage $u_T = k \cdot T/e$. n is a technology-dependent ideality factor, k is the Boltzmann constant, t is the absolute temperature and e is the elementary charge. The voltage source 30 is connected to the charging capacitor 27 and the discharge resistor 28 via the resistor 31 with the resistance value $R_0(T)$, which describes the video resistance of the rectifier diode 22. Within the equivalent circuit diagram, the noise-voltage source 32, which models the intrinsic noise $u_n$ of the amplifier 24, is also disposed at the input of the amplifier 24. The amplifier 24 has an amplification factor v.

The voltage source 30 acts via the voltage divider comprising the resistors 31 and 28 on the input of the amplifier 24. Accordingly, the output voltage $u_{out}$ of the amplifier 24 is obtained as follows:

$$u_{out} = v \cdot \left( \frac{u^2_{HF}}{nu_T} \cdot \frac{R_2}{R_0(T) + R_2} + u_n \right) \quad (1)$$

As shown in equation (1), with small signals, the classic amplification circuit presented in FIG. 3 suffers from considerable temperature dependence. The cause for this is the exponential temperature dependence of the video resistance $R_0(T)$ of the rectifier diodes 22 and 23.

Figure 5:
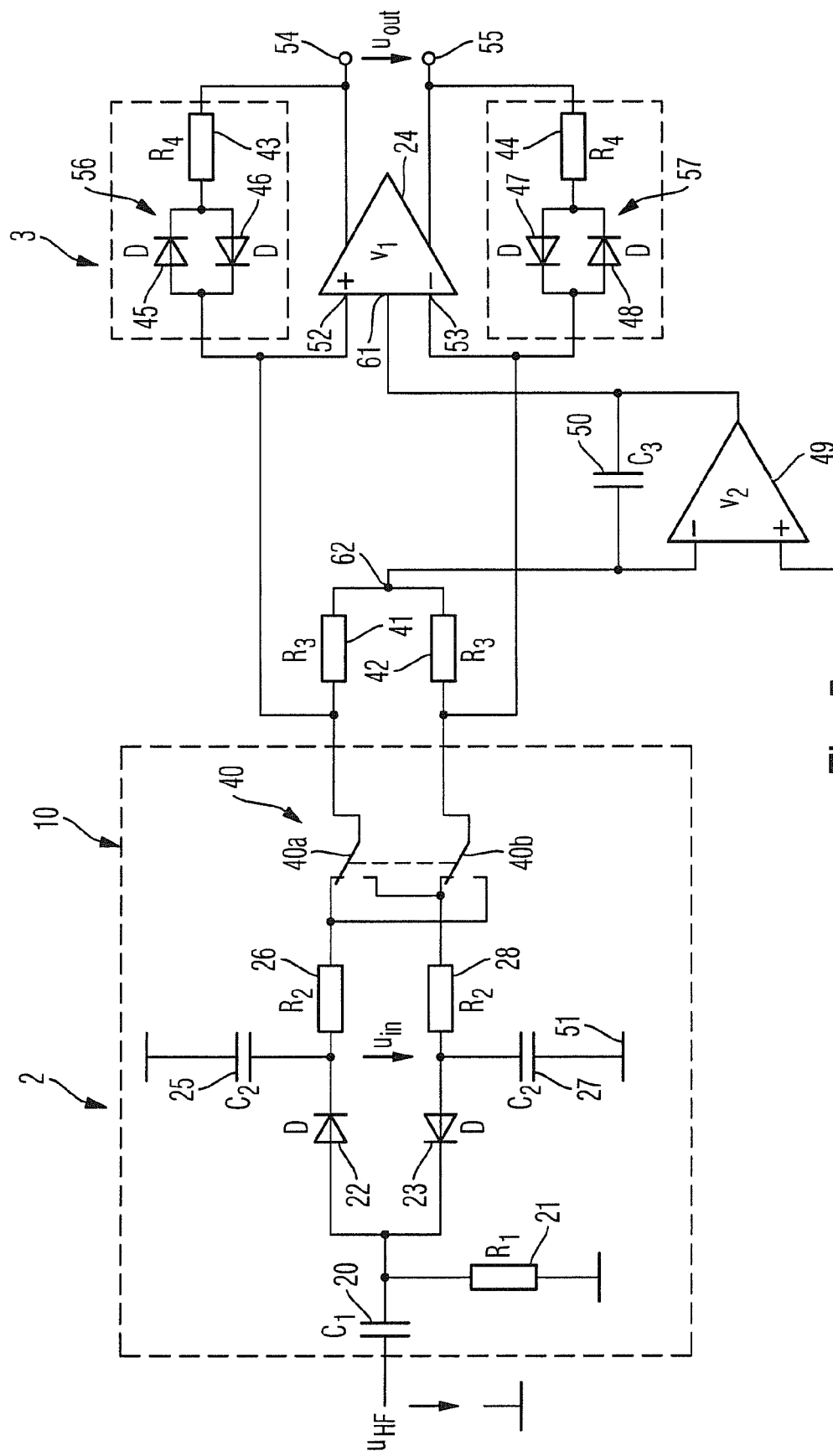
FIG. 5 shows an exemplary embodiment of the detector, chopper and amplifier of a measuring device according to the invention as shown in FIG. 2.

Assistance is provided by the circuit according to the invention, of which an exemplary embodiment is presented in FIG. 5. Elements already described with reference to FIG. 3 are indicated with matching reference numbers, thereby avoiding the need for a repetition of the associated description. With the embodiment according to the invention presented in FIG. 5, two detector diodes 22 and 23, which receive the high-frequency voltage $u_{HF}$ to be detected via a high-pass filter comprising the capacitor 20 and the resistor 21, are also preferably provided. At the same time, the capacitor 20 is used as a separating capacitor for any constant-voltage components in the signal to be detected.

The first detector diode 22 with its anode facing towards the input is used substantially for the detection of the positive half wave, while the second detector diode 23 with its cathode facing towards the input is used substantially for the detection of the negative half wave. A charging capacitor 25 and respectively 27, of which the respective other pole is connected to the circuit ground 51, is provided in each case at the output of the detector diode 22 and 23. The outputs of the detector diodes 22 and 23 are connected via a resistor 26 and respectively 28 and a switchover device 40 to one of the two inputs 52 and 53 of the DC voltage amplifier 24, which is designed in the exemplary embodiment presented as a differential amplifier. The differential amplifier amplifies a differential voltage provided between the two inputs 52 into a differential voltage $u_{out}$ between its two outputs 54 and 55.

The chopper 10 illustrated in FIG. 2, which is designed in the exemplary embodiment presented in FIG. 5 as a twin-pole switchover device 40 with the two switches 40a and 40b, is connected between the detector 2 and the amplifier 3. In each case, one of the two input poles of the switches 40a and 40b is connected via one of the two resistors 26 and respectively 28 to one of the two outputs of the detector diodes 22 and 23. The output of the first switch 40a is connected to the first input 52 of the DC voltage amplifier 24, while the output of the second switch 40b is connected to the second input 53 of the DC voltage amplifier 24.

In the first switching position of the switchover device 40 illustrated in FIG. 5, the first detector diode 22 is connected via the resistor 26 and the first switch 40a to the first input 52, and the second detector diode 23 is connected via the resistor 28 and the second switch 40b to the second input 53 of the DC voltage amplifier 24. By contrast, in the other switching position, the second detector diode 23 is connected via the resistor 28 and the first switch 40a to the first input of the DC voltage amplifier 24, while the first detector diode 22 is connected via the resistor 26 and the second switch 40b to the second input 53 of the DC voltage amplifier 24. Consequently, the definition of the two inputs 52 and 53 of the amplifier 24 with the two diodes 22 and 23 is changed in each chop phase. The inversion of the input signal at the clock pulse of the chopper control provides the advantage that the influence of a thermal drift of the DC voltage amplifier 24 is significantly reduced, because a drift of this kind acts in opposite directions in the two chop phases and is therefore eliminated. At the same time, the influence of the 1/f noise is reduced.

According to the invention, a negative-feedback is provided, wherein at least one further detector element, or, in the exemplary embodiment, at least one further detector diode, is disposed in the negative-feedback path. In the exemplary embodiment illustrated in FIG. 5, a first negative-feedback path 56 is formed between the first output 54 and the first input 53 of the DC voltage amplifier 24 designed as a differential amplifier, while a second negative-feedback path 57 is provided between the second output 55 and the second input 53 of the differential amplifier 24. In the exemplary embodiment shown in FIG. 5, the first negative-feedback path 56 comprises a third detector diode 45 and a fourth detector diode 46, which are disposed in an anti-parallel manner relative to one another. A resistor 43, which is connected in series to the anti-parallel arrangement of the detector diodes 45 and 46, adjusts the value of the negative-feedback in such a manner that the influence of $R_0(T)$ is just compensated.

A fifth detector diode 47 and a sixth detector diode 48, which are also connected in an anti-parallel manner, are provided in the second feedback path 57, wherein a resistor 44 determining the negative-feedback is once again connected in series to the anti-parallel configuration of the detector diodes 47 and 48.

The third to the sixth detector diodes 45 to 48 are not used for the detection of the signal, but only for modelling the characteristic of the first and second detector diode 22 and 23, so that the negative-feedback paths 56 and 57 form a negative feedback with a characteristic, which models the characteristic of the detector diodes 22 and 23 and the resistors $R_2$. The anti-parallel arrangement of the third and fourth detector diodes 45 and 46, on the one hand, and of the fifth and sixth detector diodes 47 and 48, on the other hand, is advantageous because of the change of polarity when switching between the two chop phases. During a first chop phase, the third diode 45 and the fifth diode 47 are disposed in the conducting direction, while the sixth diode 48 and the fourth diode 46 are disposed in the conducting direction in the other chop phase. In the case of low output voltages of the amplifier, the currents of the diode in the negative-feedback branches are so small that they are distributed between the two diodes.

Accordingly, the value of the negative-feedback is control-dependent. With a strong control of the detector diodes 22 and 23, if a large current flows through the detector diodes 22 and 23 and, accordingly, if a relatively large differential voltage $u_{in}$ is provided between the charging capacitors 25 and 27, the resulting high output voltage generates a relatively-high current through the negative-feedback diodes 45 to 48, which leads to a relatively-stronger negative feedback by comparison with the case of a relatively-weaker control of the detector diodes 22 and 23.

Figure 6:
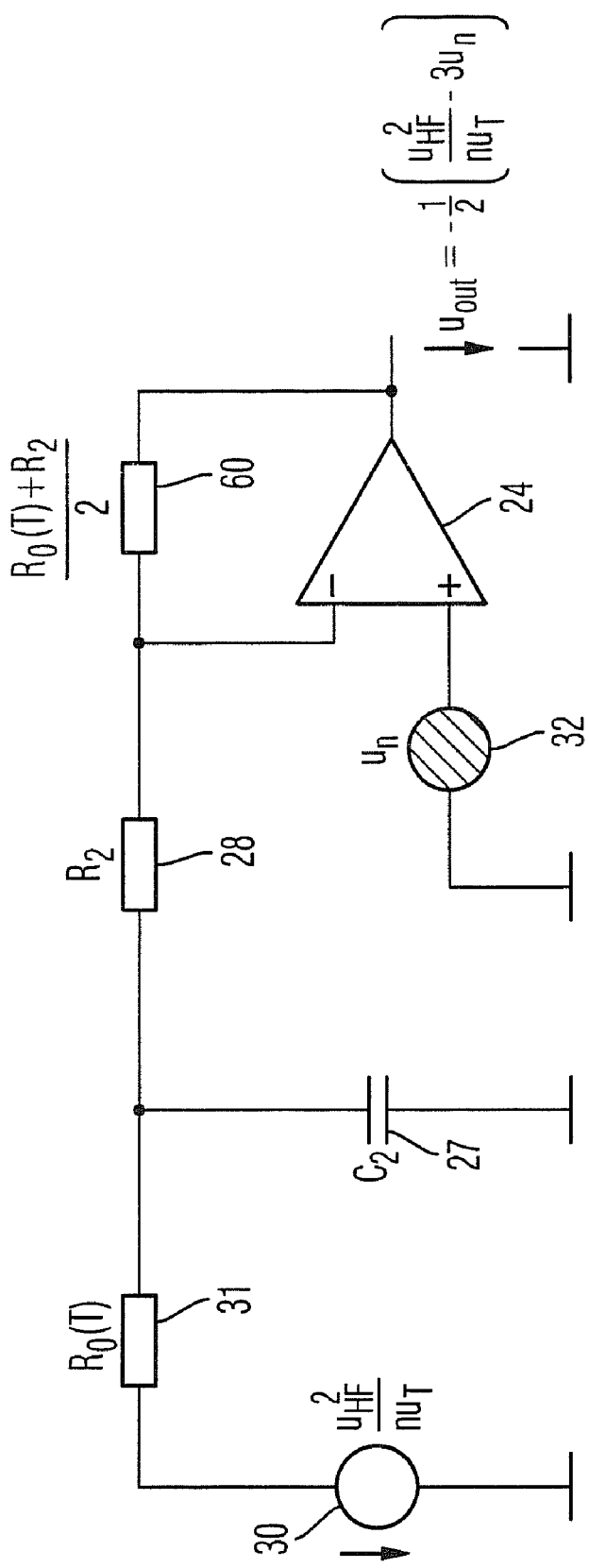
FIG. 6 shows the equivalent circuit diagram for low powers with voltage noise of the amplifier in the measuring device according to the invention as shown in FIG. 5.

Including the characteristic of the detector diodes in the negative feedback compensates the influence of the temperature dependence of the video resistance of the detector diodes 22 and 23. This is clearly evident from an inspection of the equivalent circuit diagram presented in FIG. 6 for the exemplary embodiment illustrated in FIG. 5 of the circuit according to the invention for low powers taking into consideration the voltage noise of the amplifier 24. Elements identical to those shown in FIG. 4 are indicated with identical reference numbers here also.

The resistor 28 is now connected as a series resistor between the first input (−) of the amplifier 24 and the video resistance 31 of the detector diodes 22 and 23. The voltage source 32 for the intrinsic noise of the amplifier is disposed at the other input (+) of the amplifier 24. The new addition is the resistor 60 in the feedback path, of which the resistance value is also determined from the video resistance $R_0(T)$ of the detector diodes. The output voltage $u_{out}$ is therefore obtained as follows:

$$u_{out} = -\frac{1}{2}\left(\frac{u_{HF}^2}{nu_T} - 3u_n\right) \quad (2)$$

Accordingly, in the circuit according to the invention, the output voltage $u_{out}$ is independent of the video resistance $R_0(T)$ of the detector diodes, which, because of the thermal charge-carrier generation in the diodes, is exponentially temperature dependent with reference to the Boltzmann equation. Moreover, the signal/noise ratio is hardly temperature dependent and is greater than in the case of the classic circuit shown in FIG. 3, because $R_0(T)$ is eliminated in equation (2). For reasons, which are determined by the dynamic behaviour of the circuit, the load resistance 26 or respectively 28 should be selected to be as small as possible; at room temperature, approximately one third to one fifth of the video resistance $R_0(T)$.

The differential amplifier 24 illustrated in FIG. 5 preferably has a control input 61 for common-mode control, that is to say, for controlling the symmetry of the output voltage. Because of the different offset voltages, even with an exactly-equal control of the two inputs, different voltages can occur at the two outputs. This must be eliminated by the common-mode control. In the case of the exemplary embodiment presented in FIG. 5, the two inputs 52 and 53 of the amplifier 24 are therefore connected to the common-mode input 61 via a symmetrical network consisting of the two resistors 41 and 42 and an integrator formed from the operational amplifier 49 and the capacitor 50. The voltage at the circuit node 62 must be equal to zero in the time mean. If it is not, this leads to a control voltage at the control input 61, until the symmetry is restored again.

The invention is not restricted to the exemplary embodiment presented. All of the elements described can be combined with one another as required and can also be modified within the framework of the invention.

Instead of the differential amplifier 24 illustrated in FIG. 5, the two outputs of the detector 2 can also be connected to separate, inverting amplifiers, for example, formed by operational amplifiers. The difference formation is then implemented later, for example, in a third operational amplifier. However, the circuit shown in FIG. 5 with the differential amplifier has the advantage that the zero-point drift caused by the offset-voltage drift of the amplifier is significantly reduced. The common-mode control additionally suppresses the influence of the input (bias) currents of the amplifier 24 on the zero-point drift.

Instead of a detector diode, other detector elements, such as thermal detector elements can also be used. In this context, it is also meaningful to provide these detector elements in the feedback paths, so that, here also, the feedback paths provide the same characteristic as the detector elements.

The invention claimed is:

1. A measuring device comprising:
a detector with at least one detector element; and
a DC voltage amplifier connected downstream of the detector with at least one input and at least one output,
wherein the DC voltage amplifier provides at least one negative-feedback path, which extends from the at least one output to the at least one input,
wherein at least one further detector element is disposed in the at least one negative-feedback path;
wherein the DC voltage amplifier provides a first input and a second input, and
wherein the detector provides a first detector element and a second detector element, which can be connected via a switchover device alternately to the first input or to the second input of the DC voltage amplifier.

2. The measuring device according to claim 1, wherein the DC voltage amplifier is a differential amplifier, which amplifies a differential input signal disposed between the first input and the second input to form a differential output signal disposed between the first output and the second output.

3. The measuring device according to claim 1,
wherein the DC voltage amplifier provides a first output and a second output,
wherein the first output is connected to the first input via a first negative-feedback path,
and the second output is connected to the second input via a second negative-feedback path, and
wherein each negative-feedback path contains at least one detector element.

4. The measuring device according to claim 3, wherein the first negative-feedback path provides a third detector element and a fourth detector element, and wherein the second negative-feedback path provides a fifth detector element and a sixth detector element.

5. The measuring device according to claim 4, wherein the DC voltage amplifier is a differential amplifier, which amplifies a differential input signal disposed between the first input and the second input to form a differential output signal disposed between the first output and the second output.

6. The measuring device according to claim 4, wherein the third detector element in the first feedback path and the fifth detector element in the second feedback path substantially determine the feedback, when the first detector element is connected to the first input and the second detector element is connected to the second input of the DC voltage amplifier, and wherein the fourth detector element in the first feedback path and the sixth detector element in the second feedback path substantially determine the feedback, when the first detector element is connected to the second input and the second detector element is connected to the first input of the DC voltage amplifier.

7. The measuring device according to claim 6, wherein the detector elements are diodes.

8. The measuring device according to claim 6, wherein the DC voltage amplifier is a differential amplifier, which amplifies a differential input signal disposed between the first input and the second input to form a differential output signal disposed between the first output and the second output.

9. The measuring device according to claim 4, wherein the detector elements are diodes.

10. The measuring device according to claim 9, wherein the diodes of the third detector element and the fourth detector element are arranged in an anti-parallel manner in the first feedback path, and the diodes of the fifth detector element and the sixth detector element are arranged in an anti-parallel manner in the second feedback path.

11. The measuring device according to claim 10, wherein the DC voltage amplifier is a differential amplifier, which amplifies a differential input signal disposed between the first input and the second input to form a differential output signal disposed between the first output and the second output.

12. The measuring device according to claim 9, wherein the diodes of the first detector element and the second detector element are connected to the inputs of the DC voltage amplifier in opposing polarity via the switchover device.

13. The measuring device according to claim 12, wherein the diodes of the third detector element and the fourth detector element are arranged in an anti-parallel manner in the first feedback path, and the diodes of the fifth detector element and the sixth detector element are arranged in an anti-parallel manner in the second feedback path.

14. The measuring device according to claim 13, wherein the DC voltage amplifier is a differential amplifier, which amplifies a differential input signal disposed between the first input and the second input to form a differential output signal disposed between the first output and the second output.

15. The measuring device according to claim 12, wherein the DC voltage amplifier is a differential amplifier, which amplifies a differential input signal disposed between the first input and the second input to form a differential output signal disposed between the first output and the second output.

16. The measuring device according to claim 9, wherein the DC voltage amplifier is a differential amplifier, which amplifies a differential input signal disposed between the first input and the second input to form a differential output signal disposed between the first output and the second output.

17. The measuring device according to claim 3, wherein the DC voltage amplifier is a differential amplifier, which amplifies a differential input signal disposed between the first input and the second input to form a differential output signal disposed between the first output and the second output.

18. A measuring device comprising:
a detector with at least one detector element; and
a DC voltage amplifier connected downstream of the detector with at least one input and at least one output,
wherein the DC voltage amplifier provides at least one negative-feedback path, which extends from the at least one output to the at least one input, wherein at least one further detector element is disposed in the at least one negative-feedback path, wherein the DC voltage amplifier provides a first input and a second input and a first output and a second output, wherein the DC voltage amplifier is a differential amplifier, which amplifies a differential input signal disposed between the first input and the second input to form a differential output signal disposed between the first output and the second output, and wherein the differential amplifier provides a control input for controlling symmetry of the differential output signal.

19. A measuring device comprising:

a detector with at least one detector element; and a DC voltage amplifier connected downstream of the detector with at least one input and at least one output, wherein the DC voltage amplifier provides at least one negative-feedback path, which extends from the at least one output to the at least one input, wherein at least one further detector element is disposed in the at least one negative-feedback path, wherein the DC voltage amplifier provides a first input and a second input and a first output and a second output, wherein the DC voltage amplifier is a differential amplifier, which amplifies a differential input signal disposed between the first input and the second input to form a differential output signal disposed between the first output and the second output, wherein the differential amplifier provides a control input for controlling the symmetry of the differential output signal; and wherein the two inputs of the differential amplifier are connected via a symmetrical network and an integrator to the control input.

* * * * *